(12) United States Patent
Yamasaki

(10) Patent No.: US 6,909,982 B2
(45) Date of Patent: Jun. 21, 2005

(54) DISPLAY METHOD OF PARAMETER CORRECTION CONDITIONS AND RECORDING MEDIUM ON WHICH PROGRAM TO DISPLAY PARAMETER CORRECTION CONDITION IS RECORDED

(75) Inventor: Takashi Yamasaki, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 15 days.

(21) Appl. No.: 10/273,986

(22) Filed: Oct. 18, 2002

(65) Prior Publication Data

US 2003/0076115 A1 Apr. 24, 2003

(30) Foreign Application Priority Data

Oct. 19, 2001 (JP) .......................................... 2001-322787

(51) Int. Cl.⁷ .......................... G01R 35/00; G01R 27/04
(52) U.S. Cl. .......................... 702/85; 324/601; 345/618
(58) Field of Search .......................... 702/85, 86, 108, 702/109, 127, 128; 324/74, 202, 600, 601, 602, 619; 358/296; 345/618; 348/180

(56) References Cited

U.S. PATENT DOCUMENTS

| | | | | |
|---|---|---|---|---|
| 4,816,767 A | * | 3/1989 | Cannon et al. ............. | 324/601 |
| 5,164,837 A | * | 11/1992 | Hirosawa .................... | 358/296 |
| 5,880,710 A | * | 3/1999 | Jaberi et al. ................ | 345/618 |
| 6,452,627 B1 | * | 9/2002 | Hamaguri et al. .......... | 348/180 |

FOREIGN PATENT DOCUMENTS

WO        WO 00/46612        10/2000

OTHER PUBLICATIONS

European Search Report Application No. EP 02 25 7253, dated Feb. 20, 2004, Examiner Holler, H.
"User's Guide Agilent Technologies 8712es and 8714ES RF Network Analyzers," Jun. 2000, XP002270970.
"Quick Reference Guide HP 8753E Network Analyzer," Oct. 1998, Hewlett Packard, XP002271057.
Reference Guide, Agilent Technologies 8753ES and 8753ET Network Analyzers, USA, Feb. 2001.

* cited by examiner

*Primary Examiner*—John Barlow
*Assistant Examiner*—John Le

(57) ABSTRACT

To enable the measurer to easily verify the parameter correction conditions, the correction conditions for the parameters measurable by the measurement device are concurrently displayed on the screen of the measurement device related to the ports used in the parameter measurement. The rows and columns are the receive ports and send ports. The symbol F and the symbol R indicate the type of calibration method applied to the parameters measured by the ports specified in the matrix.

27 Claims, 13 Drawing Sheets

|   | S |   |   |   |
|---|---|---|---|---|
|   | 1 | 2 | 3 | 4 |
| R 1 | — | — | — | — |
| 2 | — | — | — | — |
| 3 | — | — | — | — |
| 4 | — | — | — | — |

FIG. 7A

|   | S |   |   |   |
|---|---|---|---|---|
|   | 1 | 2 | 3 | 4 |
| R 1 | F | F | — | — |
| 2 | F | F | — | — |
| 3 | — | R | — | — |
| 4 | — | — | — | R |

|   | S |   |   |
|---|---|---|---|
|   | 1 | 2 | 4 |
| 1 | F | F | — |
| 2 | F | (F) | — |
| 3 | — | (R) | — |
| 4 | — | — | (R) |

DISPLAY METHOD OF PARAMETER CORRECTION CONDITIONS AND RECORDING MEDIUM ON WHICH PROGRAM TO DISPLAY PARAMETER CORRECTION CONDITION IS RECORDED

BACKGROUND OF THE INVENTION

1. Field of the Invention

The present invention relates to a method for displaying the measurement conditions on a measurement device. More specifically, the invention relates to the display of information related to error correction, namely, the correction conditions. The display method of the present invention is suited for use in a measurement device equipped with a plurality of ports.

2. Discussion of the Related Art

A measurement device is rarely in the ideal state for the entire apparatus and generally differences develop between the measurements and the true values. These differences, namely the causes of the measurement errors, have reproducibility and predictability over some time span or some temperature range. The measurement errors based on these causes can be removed and the measurement device is calibrated. In order to remove these measurement errors, a network analyzer, which is a measurement device, is calibrated based on measurements such as the thru, open, short, and high-precision load impedance, which are well-known electrical standards. Thus, the network analyzer can correct the measurements and display measurement results close to the true values.

A network analyzer has calibration methods such as response calibration and full N-port calibration, where N is a natural number. Each calibration method has various features such as the measurement accuracy and the measurement time. The user adopts a calibration method while considering these features. It would be convenient if the user could determine how to error correct the S-parameters during the measurement, that is, how to measure the measurement errors of the S-parameters beforehand by some calibration method and correct the measurements, because the user can judge whether or not the values of the S-parameters to be measured are valid. Therefore, a conventional network analyzer has a function to display various calibration methods applied to the S-parameters to be measured on the screen for displaying the measurement results.

FIG. 1 is a front view of a conventional network analyzer. In FIG. 1, the network analyzer 100 is a 3-port network analyzer equipped with ports A, B, and C for connecting to the device under test α (not shown) and measuring the reflection coefficient and propagation coefficient and a screen 110 for displaying the measurement conditions and the measurement results.

The trace 120, which is an S-parameter measurement, and the symbol 130 indicating the correction method are displayed on the screen 110.

The symbol 130 is "C1" when the measured S-parameters are corrected by response calibration or full 1-port calibration, "C2" when corrected by full 2-port calibration, and "C3" when corrected by full 3-port calibration. Consequently, if symbol 130 displays "C2" as shown in FIG. 1, the user can know that the S-parameters are corrected by full 2-port calibration during measurement. If the user cannot connect the device under test to two ports and cannot conduct the measurements, correct error correction is not performed.

However, the displayed calibration method is only a simple symbol display, which is inconvenient when the ports used during measurement are specified. This inconvenience is obvious when an unspecified number of users share the network analyzer.

For example, when the network analyzer 100 in this example is used and the reflection coefficient S22 is measured at port B, whether the combination of measurement ports targeted by full 2-port calibration is the port B and port A group or the port B and port C group cannot be determined by only knowing the symbol 130. Thus, if which ports were used and what kind of calibration method was applied cannot be determined during calibration, the user must verify the calibration methods of the other S-parameters and must specify the port group that should be used in the measurements. When using a conventional network analyzer, the traces of the S-parameters must be displayed in order to verify the calibration methods for the S-parameters, which is a nuisance. In addition, this specification task becomes complex as the number of ports of the network analyzer becomes large. When a plurality of calibration methods coexists and is applied, this task is extremely difficult.

Therefore, the network analyzer should provide a method that easily determines information related to the error correction of the S-parameters, that is, the correction conditions.

SUMMARY OF THE INVENTION

The problem of the present invention is to solve the problems of the prior art described above. An object of the invention is to enable the user to easily determine the parameter correction conditions by concurrently displaying the calibration states of the parameters measurable by the measurement device on the display means.

A further object is to prevent the incorrect connection of the device under test by displaying the ports used to apply correct error correction to the parameters.

A further object is to prevent errors in the measurement operation by the user by displaying the enabled state for parameter correction.

A further object is to reduce the effort expended by the user to determine the correction conditions by displaying the correction conditions regardless of how the parameter traces are displayed.

The first invention is a method for displaying the parameter correction conditions on the measurement device equipped with ports for connecting to the devices under test in order to measure the parameters and display means, wherein the correction conditions are read from the memory means storing the correction conditions, and the calibration states of all of the parameters are displayed concurrently on the display means related to the ports used in parameter measurement in order to clearly show the parameters calibrated by the calibration method having calibration enabled in the parameter error correction and the other parameters not subjected to the calibration enabled in the parameter error correction for all of the parameters measurable by the measurement device with reference to the read-out correction conditions.

The second invention is a method for displaying the parameter correction conditions on a measurement device comprised of ports for connecting to the devices under test in order to measure the parameters and display means, wherein the correction conditions are read from the memory means storing the correction conditions, and the calibration states of all of the parameters are displayed concurrently on the display means related to the ports used in parameter measurement in order to clearly show the parameters calibrated by the calibration method having calibration enabled in the parameter error correction and the other parameters not subjected to the calibration enabled in the parameter error correction for the parameters to be measured and all of the parameters to be calibrated by the parameter calibration method with reference to the read-out correction conditions.

Furthermore, a third invention concurrently displays in a matrix format on the display means during concurrent display on the display means in the first or second invention.

Furthermore, a fourth invention displays the parameters to be measured on the display means related to the ports used in parameter measurement in the first, second, or third invention.

Furthermore, a fifth invention displays the ports used for applying correct error correction when error correction is enabled for the parameters to be measured and the ports used in parameter measurement when error correction is disabled on the display means in the first, second, third, or fourth invention.

Furthermore, a sixth invention lists all of the parameters to be calibrated by the parameter calibration method when error correction is enabled from the parameters to be measured in the first, second, third, fourth, or fifth invention, and displays the enabled corrections for the listed parameters on the display means related to the ports used in parameter measurement.

Furthermore, a seventh invention is a method for displaying the parameter correction conditions on the measurement device equipped with ports for connecting to the devices under test in order to measure the parameters and the display means, wherein the correction conditions of the parameters to be measured are read out from the memory means storing the correction conditions, and the read out correction conditions are referenced and displayed on the display means related to the calibration method of the parameters to be measured and the ports used to apply the calibration method.

BRIEF DESCRIPTION OF THE DRAWINGS

FIG. 7A shows a display example of the correction conditions in the first embodiment using the method of the present invention;

FIG. 7B shows a display example of the correction conditions in the first embodiment using the method of the present invention;

FIG. 7C shows a display example of the correction conditions in the first embodiment using the method of the present invention;

FIG. 7D shows a display example of the correction conditions in the first embodiment using the method of the present invention;

FIG. 7E shows a display example of the correction conditions in the first embodiment using the method of the present invention;

FIG. 7F shows a display example of the correction conditions in the first embodiment using the method of the present invention;

FIG. 7G shows a display example of the correction conditions in the second embodiment using the method of the present invention;

DETAILED DESCRIPTION OF THE INVENTION

The present invention is described with reference to the embodiments shown in the attached drawings.

Figure 1:
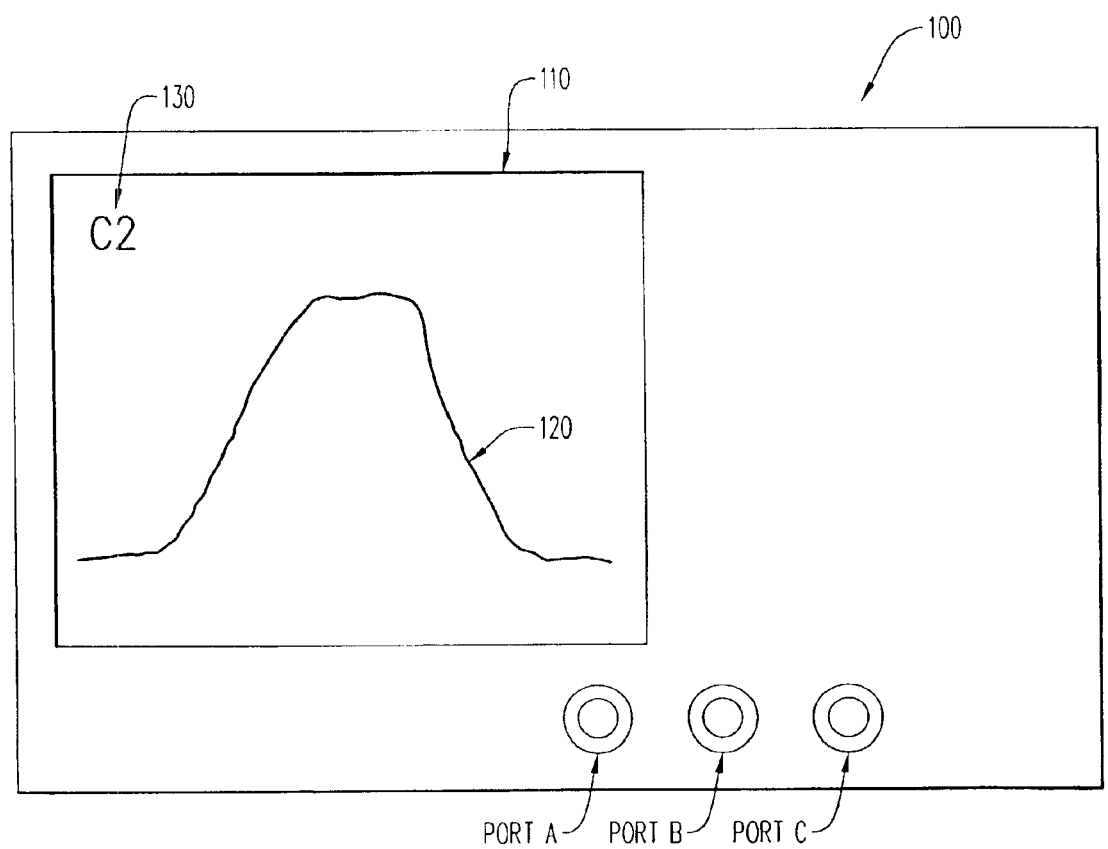
FIG. 1 is a front view of a conventional network analyzer.
Figure 2:
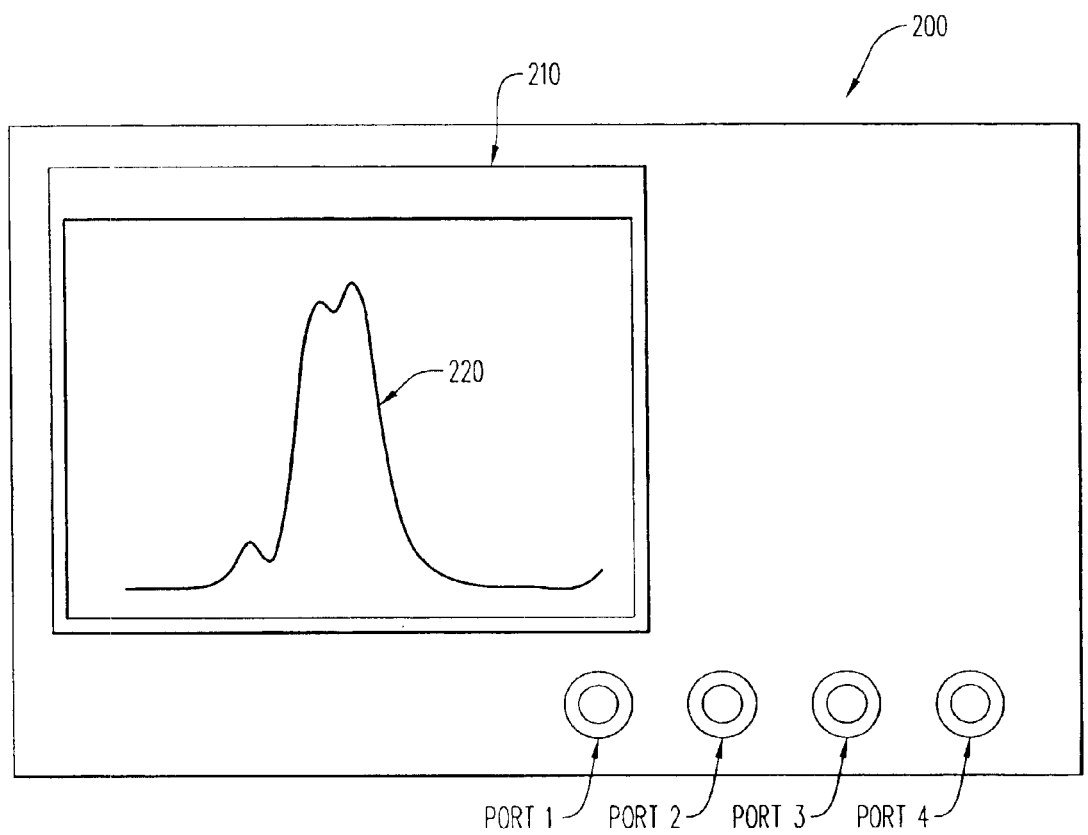
FIG. 2 is a front view of the network analyzer displaying the correction conditions by using the method of the present invention.

FIG. 2 is a front view of a network analyzer displaying information related to error correction, that is, the correction conditions, according to the present invention. In FIG. 2, the network analyzer 200 is comprised of port 1, port 2, port 3, and port 4 for connecting to the devices under test, and a screen 210 for displaying the measurement conditions and the measurement results, and is a 4-port network analyzer capable of measuring the reflection coefficients at each port and the transmission coefficients between the ports. The trace 220, which is the S-parameter measurement, and the symbol 230 indicating the calibration method are displayed on the screen 210. The reflection coefficient of each port and the transmission coefficient between the ports are generally called S-parameters. The S-parameters append two numbers to the letter S. These numbers indicate the send port and the receive port used to measure the S-parameter. For example, S11 indicates the reflection coefficient obtained when the measurement signal is transmitted from port 1 and the measurement signal is received at port 1. S21 indicates the transmission coefficient obtained when the measurement signal is transmitted from port 1, and the measurement signal is received at port 2.

Figure 3:
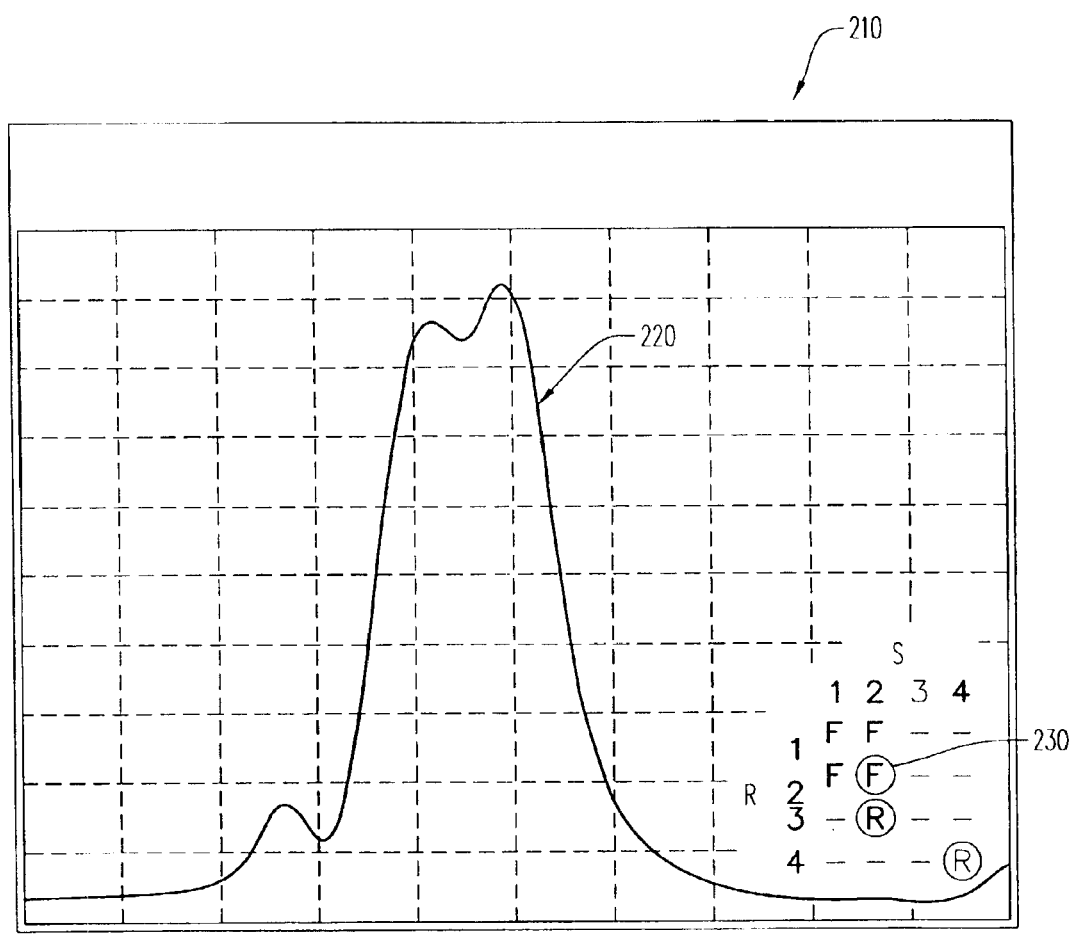
FIG. 3 shows an example of the display of the screen that is the first embodiment of the method of the present invention.

The first embodiment shown in FIG. 3 is the screen 210 displaying the correction conditions according to the method of the present invention. The features of this display example are symbol 230 indicates which calibration method is the basis of the error correction applied to the S-parameters and concurrently displays the symbols related to all of the S-parameters measurable by the network analyzer on the screen 210. Furthermore, another feature is to jointly use with a highlighted display such as bold characters to display the enable states of the corrections and to indicate the ports the user should use in order to perform correct error correction of the S-parameters to measure the desired S-parameters.

In other words, the applied calibration methods are displayed in a 4×4 matrix for the 16 S-parameters measured by a 4-port network analyzer. The column indicates the number of the send port related to each S-parameter. The row indicates the number of the receive port related to each S-parameter. For example, the symbol "F" displayed in row 1 and column 1 means that S11 was calibrated by the full port calibration method. The symbol "R" displayed in row 3 and column 2 means that S32 was calibrated by the response calibration method. The symbol "-" displayed in row 1 and column 4 means that the calibration enabled in the error correction of S14 is not applied. Since S22 is corrected by full port calibration, and S11, S12, and S21 are calibrated by full port calibration, the calibration is performed by full 2-port calibration applied to the port 1 and port 2 group.

The symbol R displayed in row 3 and column 2 is highlighted as a bold character. This means that the error correction of S32 is enabled. Furthermore, character 1 and character 2 of the send port and the receive port are highlighted and displayed in bold characters. This indicates the ports that should connect to the device under test in order to perform correct error correction when measuring S22. In this case, the indication is the device under test must be connected to port 1 and port 2. The symbols related to S22, S32, and S44 are circled, highlighted, and displayed. This means that these S-parameters are the measurement targets.

Figure 4:
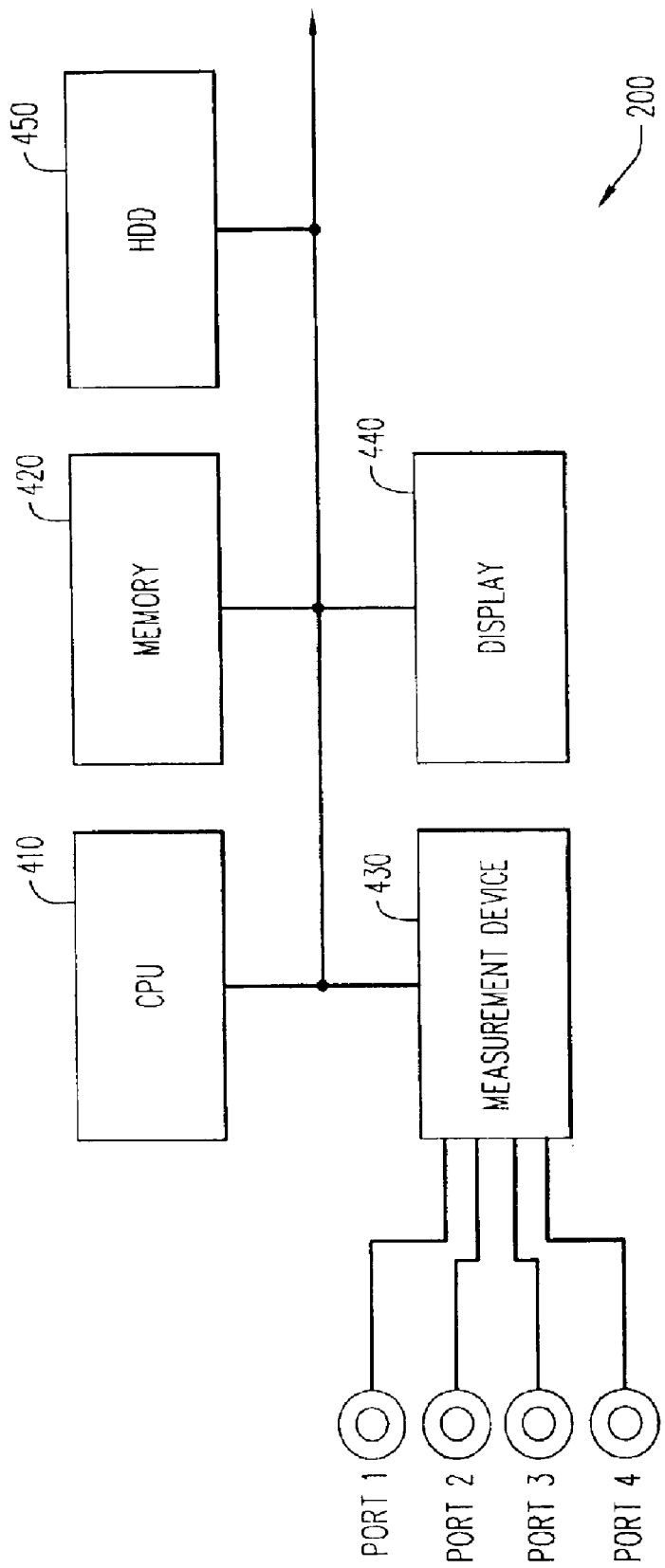
FIG. 4 shows the configuration of the network analyzer that displays the correction conditions by using the method of the present invention.

FIG. 4 shows the configuration of the network analyzer 200 for implementing the display of these correction conditions. In FIG. 4, the network analyzer 200 is comprised of a CPU 410; a memory 420, which is the memory means; a measurement device 430; a display 440, which is the display means; and a hard disk drive (HDD) 450, which is the recording medium.

The CPU 410 controls the measurement device 430 and the display 440 by executing the program for displaying the correction conditions read out from the HDD 450, and displays the correction conditions on the screen 210.

Figure 5A:
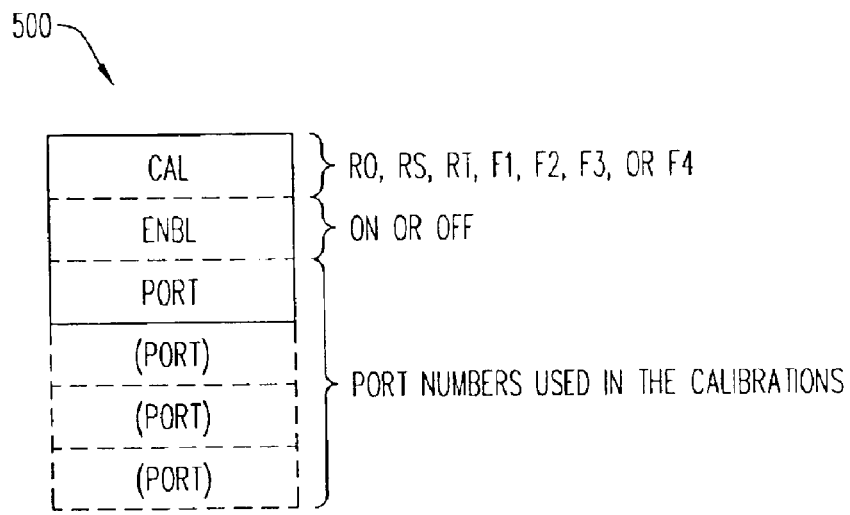
FIG. 5A shows the format of an information block.

The memory 420 saves the S-parameter correction conditions. The correction conditions are stored in one information block comprised of the applied calibration method, the port numbers used in the execution of the calibration method, and the enable states of the corrections by the calibration method. FIG. 5A shows the format of the information block. In FIG. 5A, CAL is the variable indicating the type of applied calibration method and stores information indicating either open response calibration (RO), short response calibration (RS), thru response calibration (RT), full 1-port calibration (F1), full 2-port calibration (F2), full 3-port calibration (F3), or full 4-port calibration (F4). ENBL is the variable indicating the correction enabled state and stores information indicating either correction enabled (ON) or disabled (OFF) for the S-parameters to be calibrated. PORT is the variable indicating the port numbers used in the calibration and stores the port numbers for only the number of ports used in the calibration. When response calibration was performed, first the receive port and then the send port are stored. For example, if full 2-port calibration was performed on port 1 and port 2, the numbers 1 and 2 are stored. When the response calibration was applied to S32, first the number 3 and then the number 2 are stored.

Figure 5B:
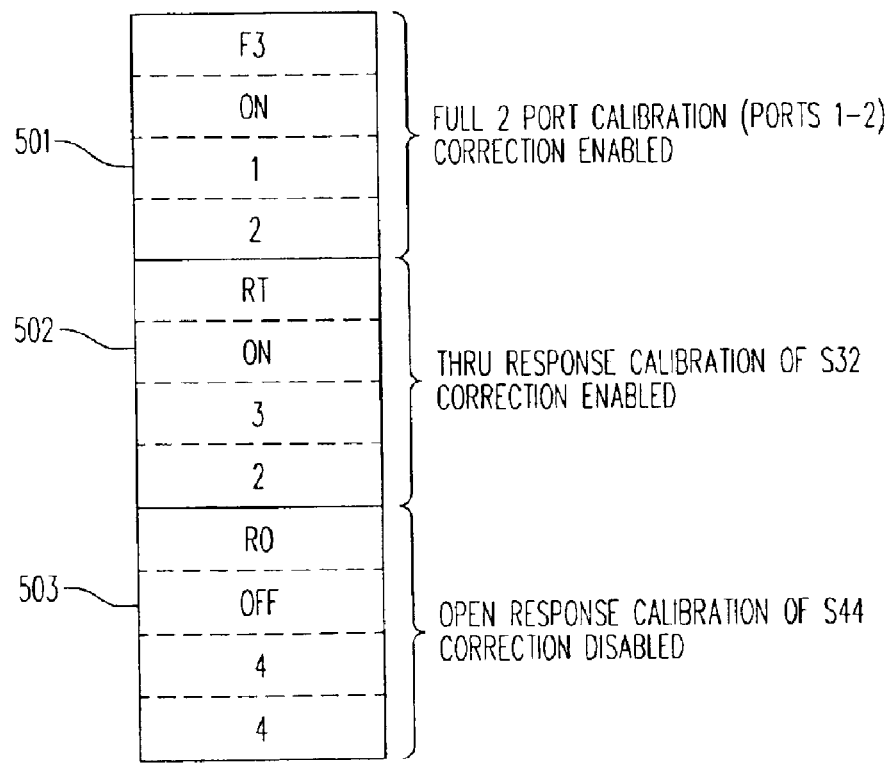
FIG. 5B shows an example of a plurality of information blocks.

The information blocks exist in memory 420 only for the number of applied calibrations. FIG. 5B is an example when there are three information blocks. In FIG. 5B, the first information block 501 indicates that full 2-port calibration is applied to port 1 and port 2, and error correction is enabled for S11, S12, S21, and S22 based on the errors obtained by this calibration. Next, the second information block 502 indicates that thru response calibration is applied to S32 and error correction is enabled for S32 based on the error obtained by this calibration. Next, the third information block 503 indicates that open response calibration is applied to S44 and error correction is disabled for S44. The error of each S-parameter is measured by a unique calibration method. Consequently, for the 4-port network analyzer in this example, the maximum number of information blocks coexists when response calibration was applied to each S-parameter. The number of information blocks in this case is 16.

The measurement device 430 is equipped with ports 1, 2, 3, and 4, and measures the reflection coefficient at each port and the transmission coefficient between the ports.

Display 440 is equipped with a screen 210, is controlled by the CPU 440, and displays the measurement results and the correction conditions.

HDD 450 records the program used by the network analyzer 200 to display the correction conditions.

Figure 6:
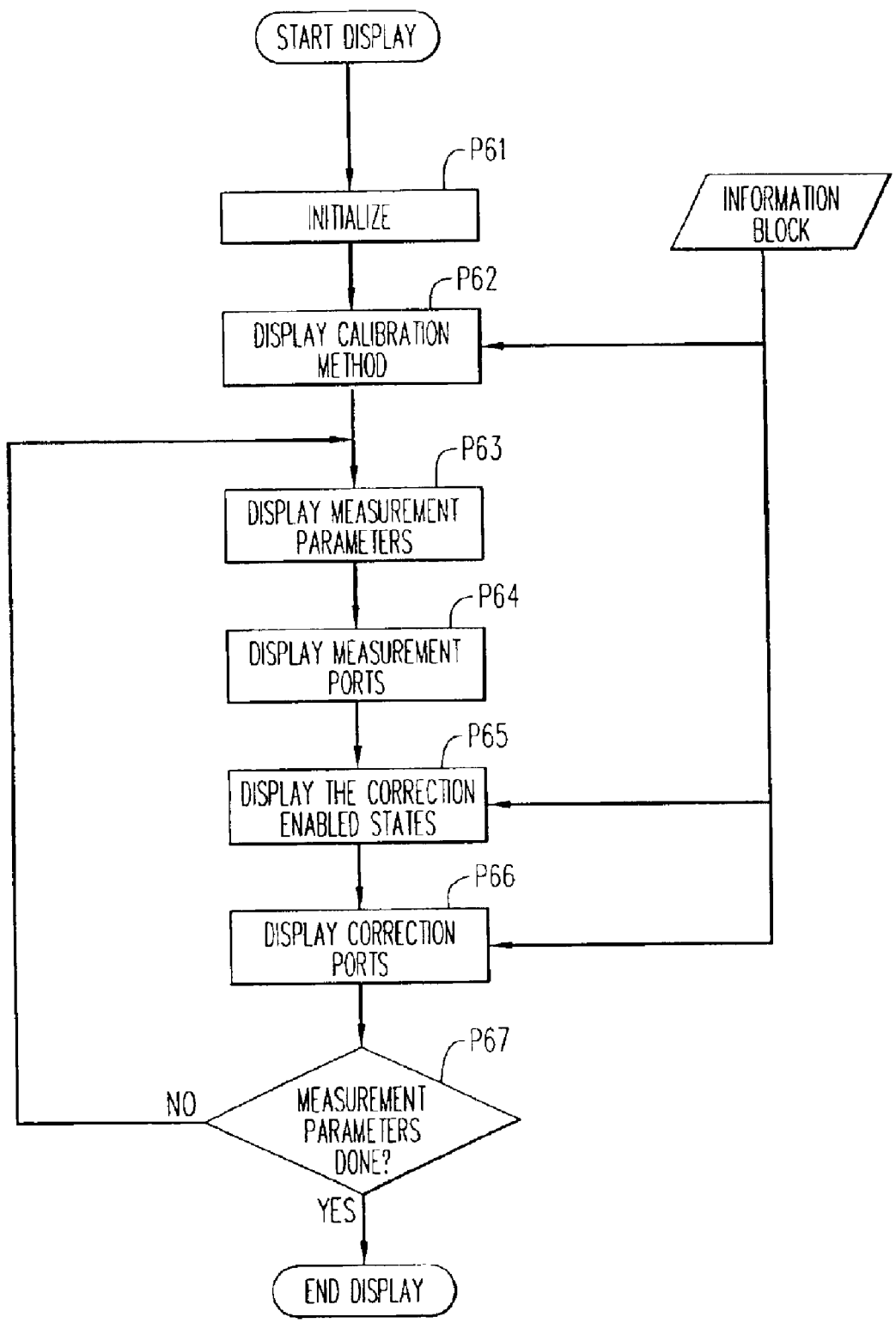
FIG. 6 shows the display procedure of the correction conditions in the first embodiment using the method of the present invention.

In the above configuration, the processing steps of the program used by the network analyzer 200 to display the correction conditions on the screen 210 are illustrated in the flow chart shown in FIG. 6. FIGS. 7A to 7F, which are referenced, are the drawings showing a part of the screen 210.

Figures 7A, 7B:
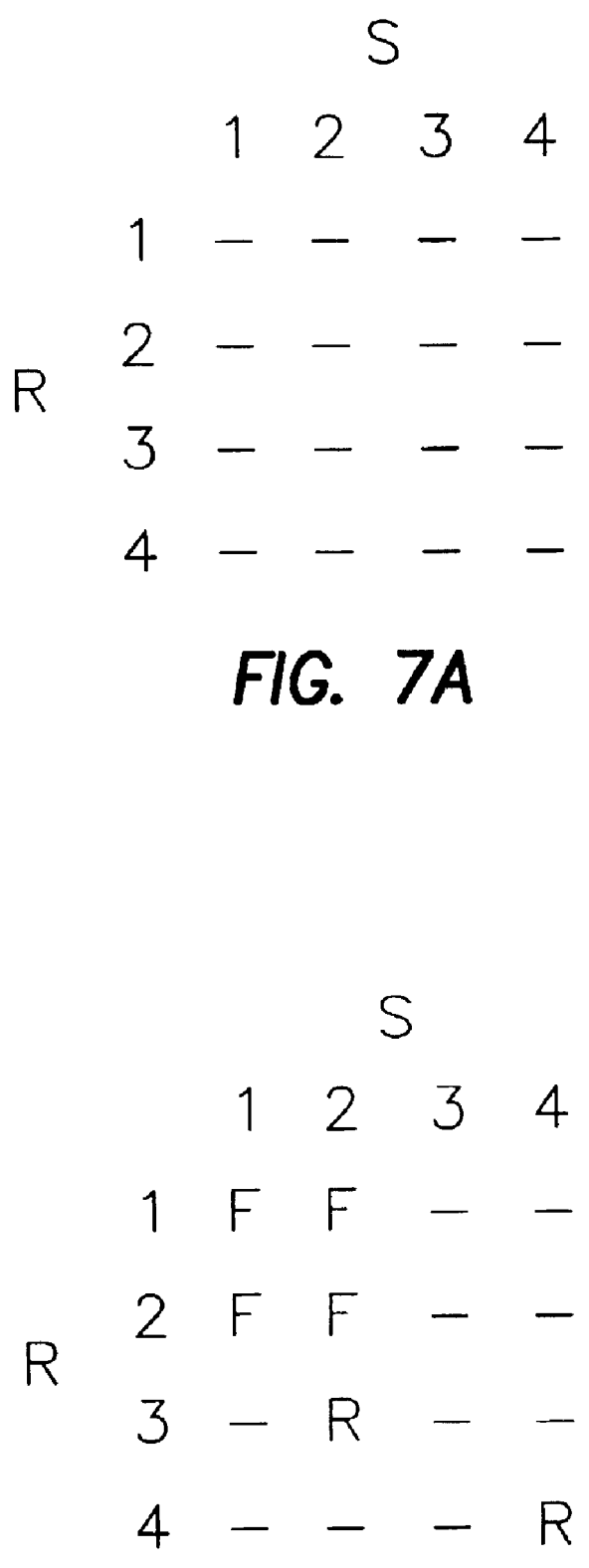

In FIG. 6, step P61 initializes the region displaying the correction conditions. The 4×4 matrix with the symbol "-" in all of the elements is displayed. The rows and columns of the matrix are displayed in order of 1 to 4 to indicate the row number and the column number. "R" that indicates the receive ports is displayed in the rows, and "S" that indicates the send ports is displayed in the columns. FIG. 7A shows the correction conditions in this case. Then the process advances to step P62.

In step P62, the applied calibration method is displayed as a symbol on the screen related to the ports used in the calibration. The displayed symbols are the contents of the CAL variable, namely, the type of applied calibration method, are successively read out from all of the information blocks. The displayed symbol is the symbol "R" if the content is the response calibration method and the symbol "F" if the full N-port calibration method, where N is an integer from 1 to 4. The display location of the symbol is set by the S-parameter to be calibrated. Specifically, the contents of the PORT variable are referenced from the information block. All of the S-parameters to be calibrated are listed, and specified by the send port and receive port needed to measure each S-parameter. For example, if information block 1 in FIG. 5B is referenced, the CAL variable indicates full 2-port calibration, and two port numbers are fetched from the PORT variable. Next, all of the S-parameters to be calibrated based on the fetched port numbers are listed. In other words, S11, S12, S21, and S22 are listed. Thus, the symbol "F" is displayed in the four elements of row 1, column 1; row 1, column 2; row 2, column 1; and row 2, column 2.

If information block 2 in FIG. 5 is referenced, CAL variable indicates thru response calibration, and two port numbers are fetched from the PORT variable. Next, the S-parameters calibrated based on the fetched port numbers are listed. In other words, S32 is listed. Thus, the symbol "R" is displayed in row 3, column 2. For all of the information blocks shown in FIG. 5B, the correction conditions are displayed as shown in FIG. 7B when the process of this step was performed. Then the process advances to step P63.

The processes from step P63 to step P67 select each S-parameter to be measured and perform the process.

Figures 7C, 7D:
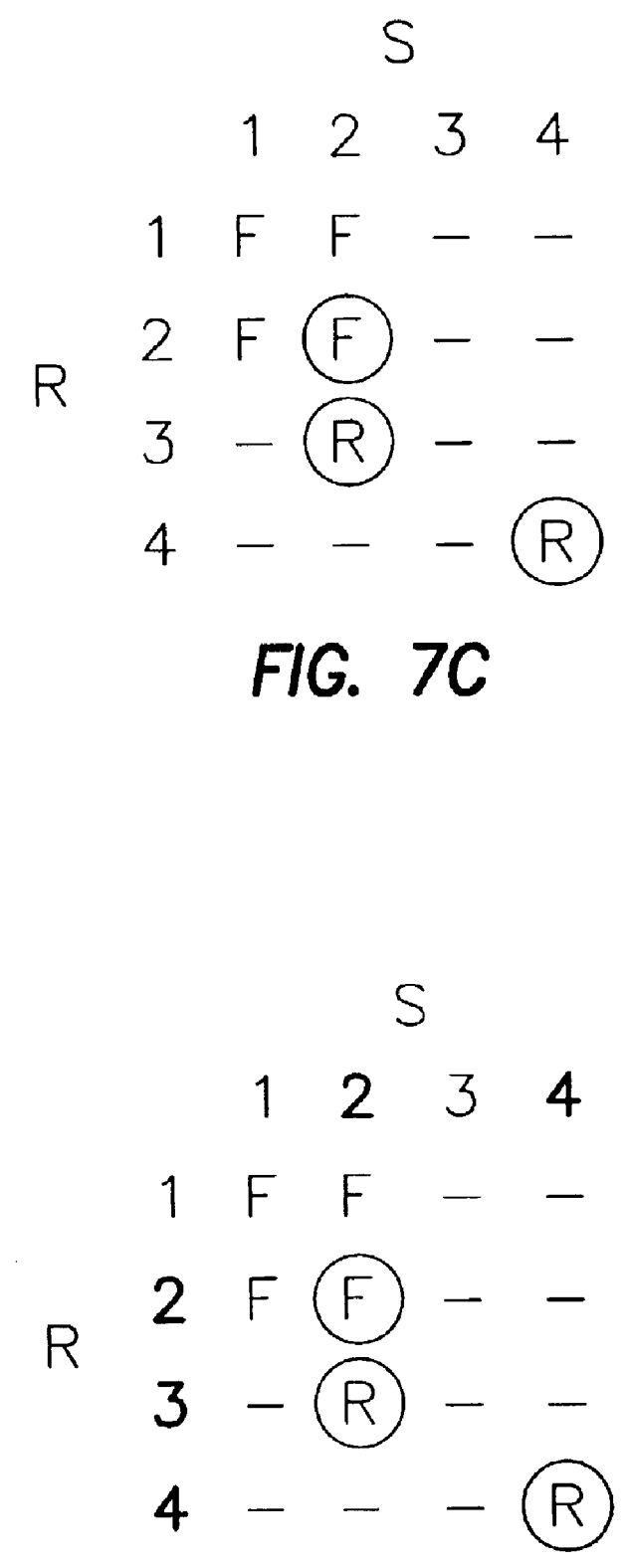

In step P63, the symbols related to the S-parameters to be measured are circled and highlighted to indicate that the S-parameter will be measured. Let S22, S32, and S44 be the measured S-parameters. If the process of this step is performed for all of the information blocks shown in FIG. 5B, the correction conditions are displayed as shown in FIG. 7C. Then the process advances to step P64.

In step P64, the number of the send port and the number of the receive port used to measure the S-parameters to be measured are displayed as bold characters and highlighted. Let S22, S32, and S44 be the measured S-parameters. If the processing until this step was performed on all of the information blocks shown in FIG. 5B, the correction conditions are displayed as shown in FIG. 7D. Then the process advances to step P65.

In step P65, if the S-parameters to be measured are calibrated by any calibration method and correction is enabled, the enabled corrections of the S-parameters are displayed. At this time, the enabled corrections are displayed for all of the S-parameters to be calibrated by the S-parameter calibration method. Specifically, the CAL variable and PORT variable are successively read out from all of the information blocks with the ENBL variable set to ON, and the information blocks containing the S-parameters to be measured in the calibration targets are searched for.

The CAL variable and PORT variable from the found information blocks are referenced, and all of the S-parameters to be calibrated are listed. All of the symbols related to the listed S-parameters are displayed and highlighted as bold characters. Let S22, S32, and S44 be the measured S-parameters. If the process of this step is applied to all of the information blocks shown in FIG. 5B, the correction conditions are displayed as shown in FIG. 7E.

In step P66, the send port and receive port used in measuring the S-parameters related to the symbols displayed as bold characters are highlighted as bold characters and displayed. In the Fig., the send port and the receive port are generally called the correction ports. Let S22, S32, and S44 be the measured S-parameters. If the processing up to this step is applied to all of the information blocks shown in FIG. 5B, the correction conditions are shown in FIG. 7F. Then the process advances to step P67.

In step P67, a new S-parameter to be measured is selected and the process advances to step P62. If there is no S-parameter that can be selected, the processes from step P63 to step P66 are finished for all of the measurable S-parameters, and this display process ends.

According to the procedure described above, the correction conditions are displayed on the screen of the network analyzer. The features of each step are as follows. Based on the processes in step 61 and step 62, the correction conditions are read out from the memory. Then the calibration states of all of the S-parameters are displayed concurrently on the screen 210 related to the ports used in S-parameter measurement in order to clearly show the S-parameters calibrated by the calibration method having calibration enabled in the S-parameter error correction and the other S-parameters not subjected to the calibration enabled in the S-parameter error correction for all of the S-parameters measurable by the network analyzer with reference to the information blocks. In step 63, the S-parameters to be measured are displayed on the screen 210 related to the ports used in measuring the S-parameters. Furthermore, based on the processes in step 64 and step 66, the ports used to apply correct error correction when error correction is enabled for the S-parameters to be measured and the ports used in the S-parameter measurement when error correction is disabled are displayed on the screen 210. The process in step 65 lists all of the S-parameters to be calibrated by the calibration method for the S-parameters when error correction is enabled for the S-parameters to be measured. The enabled corrections for the listed parameters are displayed on the screen 210 related to the ports used in S-parameter measurement.

The user looks at the display based on the above procedure and can determine in a glance which calibrations were applied to all of the S-parameters measured by the network analyzer. The S-parameters to be measured, the enable states for S-parameter correction, and the ports that should be used to correctly perform the S-parameter error correction can similarly be determined in a glance. Consequently, the user can easily determine a great deal of information related to S-parameter error correction.

Figure 7G:
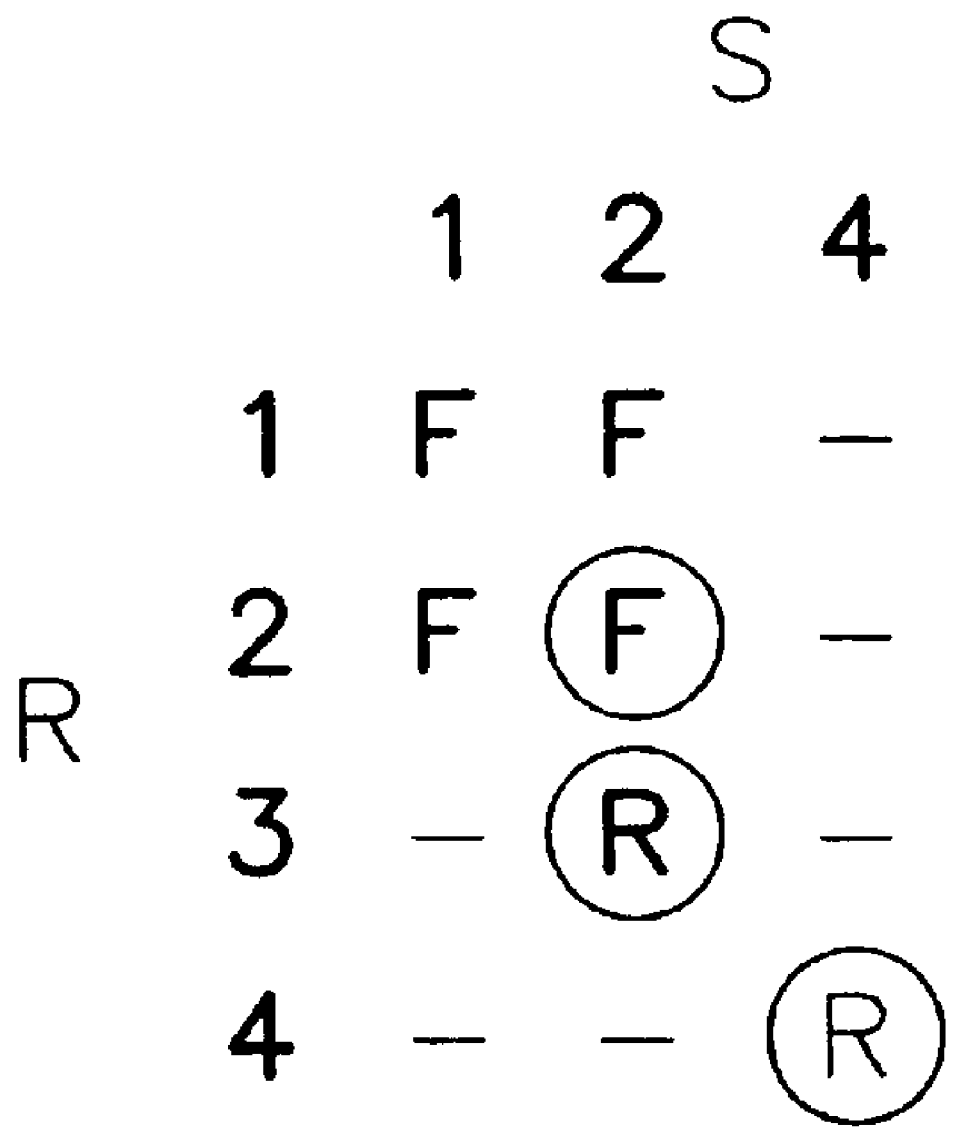

The second embodiment in FIG. 7G is a portion of the screen 210 displaying the correction conditions according to the method of the present invention. A feature of this display example is that the correction conditions finally displayed in the first embodiment are limited to the correction conditions related to the S-parameters to be measured and the S-parameters to be calibrated by the parameter calibration method.

The second embodiment displays the correction conditions by adding one more step to the flow chart shown in FIG. 6 for the same configuration as the first embodiment shown in FIG. 4. In the second embodiment, the processing steps of the program used by the network analyzer 200 to display the correction conditions on the screen 210 are presented below by using the flow chart shown in FIG. 8.

Figure 8:
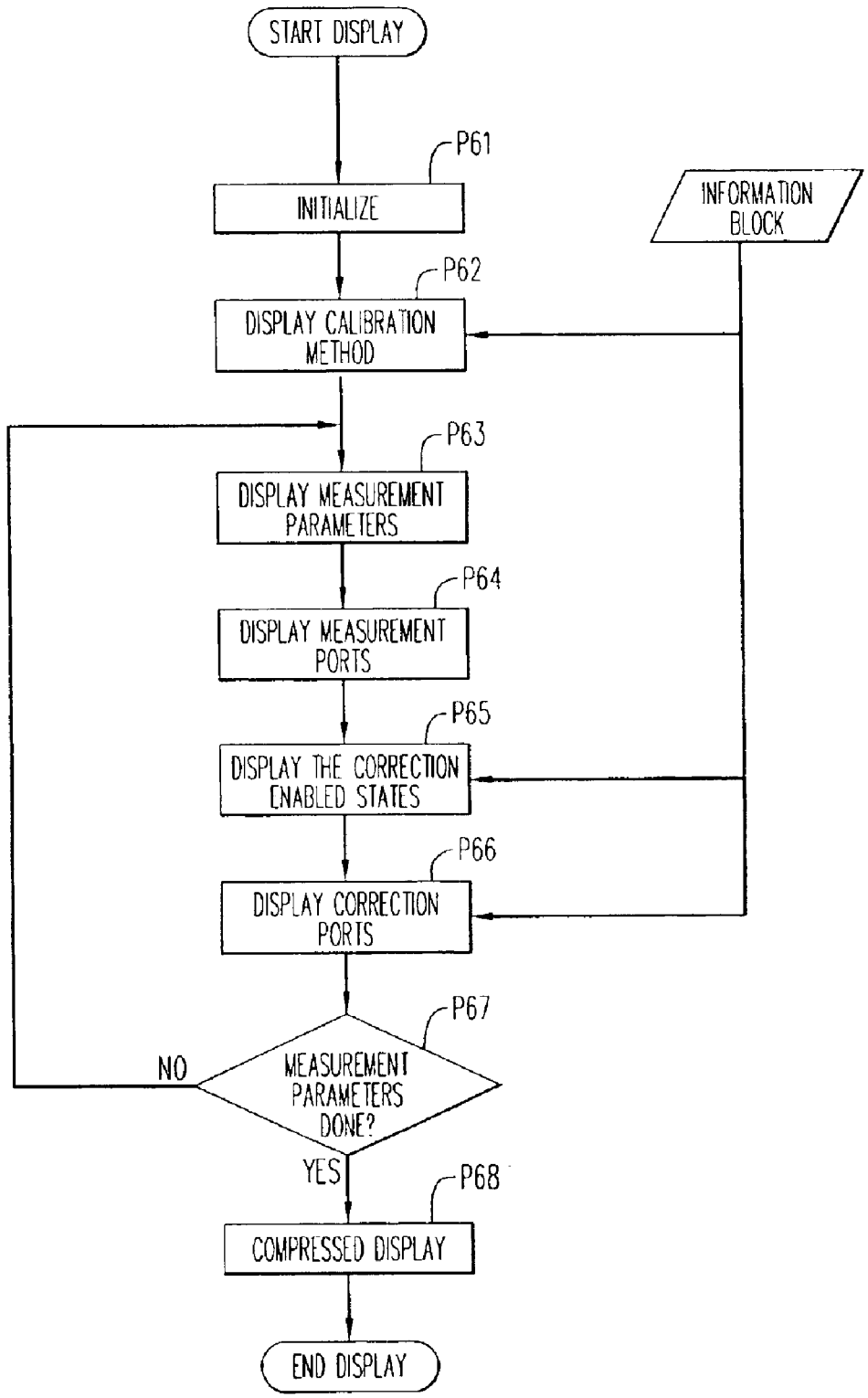
FIG. 8 is a flow diagram of the display procedure of the correction conditions in the second embodiment using the method of the present invention.

The processes in step P61 to step P67 in FIG. 8 have already been explained in the first embodiment. However, after the process in step P67 ends, the process advances to the newly added step P68.

In step 68, the displayed matrix is compressed. Specifically, the rows and columns containing the symbols displayed as bold characters or circled symbols remain. The other rows and columns are deleted. Furthermore, space can be deleted by packing the rows and columns to compress the entire matrix, then the matrix is displayed.

The display of the correction conditions according to the second embodiment concurrently displays the calibration states of the S-parameters to be measured and the S-parameters to be calibrated by the parameter calibration method on the screen 210 related to the ports used in the S-parameter measurement. Therefore, the display area can be reduced compared to the first embodiment.

The display examples described previously can be modified if the correction conditions of the S-parameters are concurrently displayed. Several examples are presented below.

For example, the character highlighting means can use colored characters instead of using bold characters or circling if the differences can be recognized when one character is compared to another character. The send ports can be assigned to the rows and the receive ports to the columns. Furthermore, the matrix can be rotated by any angle and displayed. In addition, the correction conditions can be displayed by using diagrams and are not limited to symbols and numbers in the matrix display.

Figure 9:
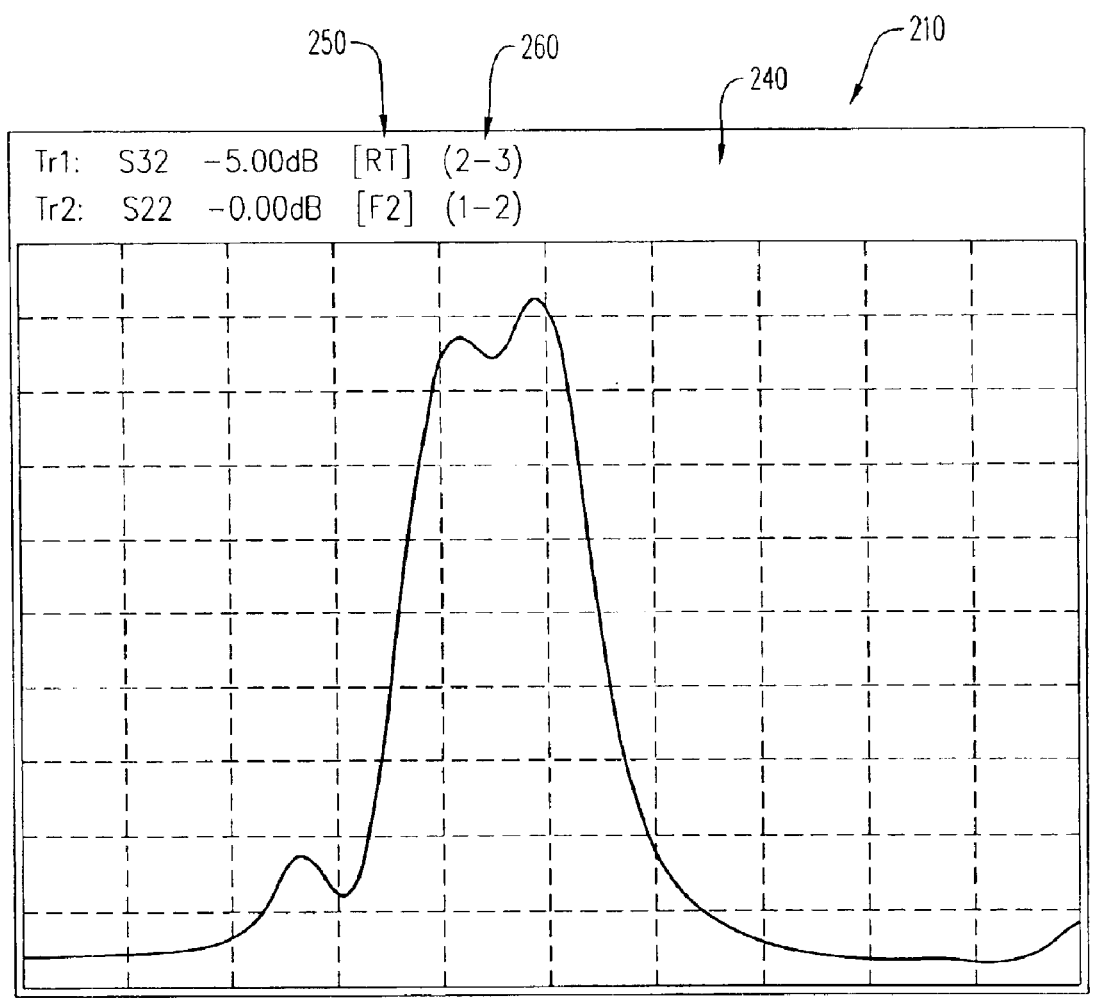
FIG. 9 shows a display example of the correction conditions in the third embodiment using the method of the present invention.

The third embodiment in FIG. 9 is the screen 210 displaying the correction conditions according to the method of the present invention. In FIG. 9, the screen 210 is provided with a region 240 for displaying the measurement results of the S-parameters. Tr1 and Tr2 shown in FIG. 9 represent the traces. S32 and S22 represent the S-parameters to be measured. The numbers displayed to the right of S32 and S22 are the measurements of the S-parameters. The features of this display example are representing the calibration method applied to the S-parameters by the symbol 250 when the error correction is enabled for the S-parameters to be measured, and displaying the group 260 of ports that should be used by the user to correctly perform the error correction of the S-parameters.

Symbol 250 is displayed when error correction is enabled for the S-parameters to be measured. The symbol indicating the open response calibration (RO), short response calibration (RS), thru response calibration (RT), full 1-port calibration (F1), full 2-port calibration (F2), full 3-port calibration (F3), or full 4-port calibration (F4) is displayed. The group 260 of ports displays the group of ports that should be used by the user in order to correctly perform the error correction of the S-parameters to be measured.

The processing steps of the display program for the network analyzer 200 having the same configuration as the first embodiment shown in FIG. 4 to display the correction conditions on the screen 210 are presented below by using the flow chart shown in FIG. 10.

Figure 10:
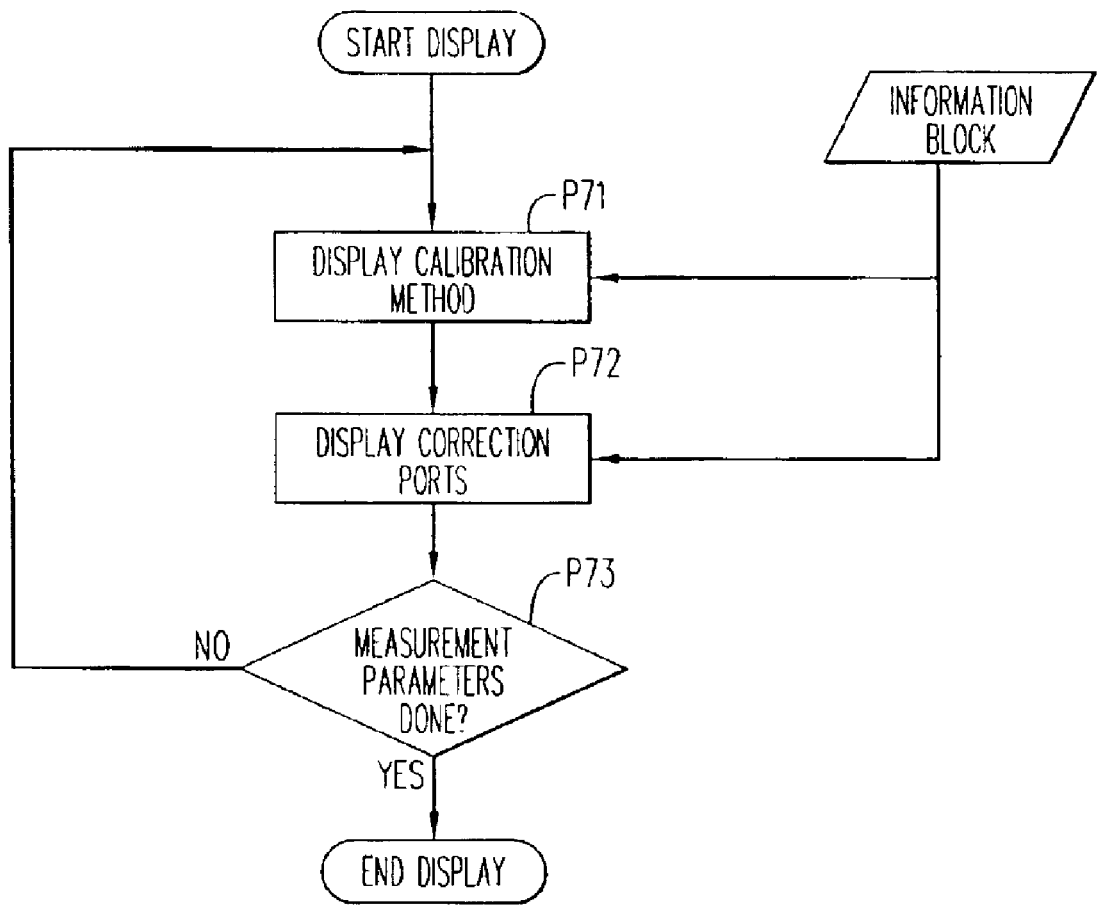
FIG. 10 shows the display procedure of the correction conditions in the third embodiment using the method of the present invention.

In FIG. 10, the processes from step P71 to step P73 select one S-parameter to be measured and apply the processing.

In step 71, if the S-parameters to be measured are calibrated by any calibration method and correction is enabled, the calibration methods applied to the S-parameters are displayed. Specifically, the contents of the CAL variable and the PORT variable are successively read from all of the information blocks having the ENBL variable set to ON. The information blocks containing S-parameters to be measured as the calibration targets are searched for. The CAL variable is referenced from the found information blocks and the calibration method is displayed.

If the S-parameters to be measured are calibrated by any calibration method and have corrections enabled in step 72 and step 71, the group of ports used when applying the S-parameter calibration method, that is, the correction ports, is displayed. Specifically, the CAL variable is referenced from the information blocks found above, and the calibration method is displayed.

In step P73, a new S-parameter to be measured is selected, and the process advances to step P71. If there are no S-parameters that can be selected, this display process ends because the processes in step P71 and step P72 have finished for all of the measurable S-parameters.

The display of the correction conditions according to the third embodiment can reduce the display area compared to the second embodiment for display on the screen 210 related to the calibration methods of the S-parameters to be measured and the ports used to apply the calibration methods.

If the programs shown in FIGS. 6, 8, and 10 are recorded on the recording medium so that the measurement device can execute the programs, the recording medium can be installed in the measurement device and can be provided separately from the measurement device.

For example, the programs are stored on a recording medium such as a CD-ROM, floppy disk, compact flash memory, or externally connected HDD that can be attached to and detached from the measurement device, and can be loaded from these recording media to the measurement device. The programs can be recorded on the ROM provided in the network analyzer and loaded on the measurement device.

The objective of the present invention is to concurrently display the calibration states of the parameters measurable by the measurement device on the display means to enable the user to easily determine the parameter correction conditions.

The ports used to apply the correct error correction to the parameters are displayed; therefore, incorrect connections to the devices under test can be prevented.

Furthermore, the enable states of the parameter corrections are displayed, and operational errors by the user when measuring can be prevented. And regardless of the trace display of the parameters, the correction conditions are displayed. Therefore, the effort expended by the user to determine the correction conditions can be reduced.

What is claimed is:

1. A method of displaying parameter correction conditions in a determination apparatus having ports to which a device under test is connected in order to determine parameters, a display means, and a memory means, comprising:

reading said correction conditions from said memory means storing said correction conditions; and displaying a calibration status of all of said parameters that can be determined with said determination apparatus and port information relating to said parameters all at once in association with each other on said display means, with reference to said read correction conditions, wherein the displaying step includes an indicator conveying the occurrence of an error correction calibration of said parameters and the error correction calibration method.

2. The method of claim 1, wherein said calibration status and said port information displayed on said display means are displayed in matrix form.

3. The method of claim 1, further comprising indicating said parameters to be determined on said display means.

4. The method of claim 1, further comprising indicating said port information relating to said parameters to be determined, wherein port information for conducting said calibration for error correction is displayed when an error correction of said parameters is effective and said port information used in determination of said parameters is indicated when said error correction of said parameters is ineffective.

5. The method of claim 1, further comprising:

indicating whether an error correction of said parameters is effective on said display means.

6. The method of claim 1, wherein said determination apparatus is a network analyzer and said parameters are S parameters.

7. A method of displaying parameter correction conditions in a determination apparatus having ports to which a device under test is connected in order to determine parameters, a display means, and a memory means, comprising:

reading said correction condition from said memory means storing said correction conditions; and displaying a calibration status of said parameters to be determined, and all of said parameters used in the calibration of said parameters to be determined, and port information relating to these parameters all at once in relationship to each other on said display means, with reference to said read correction conditions, wherein the displaying step includes an indicator conveying the occurrence of an error correction calibration of said parameters and the error correction calibration method.

8. The method of claim 7, wherein said calibration status and said port information displayed on said display means are displayed in matrix form.

9. The method of claim 7, further comprising indicating said parameters to be determined on said display means.

10. The method of claim 7, further comprising indicating said port information relating to said parameters to be determined, wherein port information for conducting said calibration for error correction is indicated when said error correction of said parameters is effective and said port information used in determination of said parameters is indicated when said error correction of said parameters is ineffective.

11. The method of claim 7, further comprising:
indicating whether an error correction of said parameters is effective on said display means.

12. The method of claim 7, wherein said determination apparatus is a network analyzer and said parameters are S parameters.

13. A method of displaying the parameter correction conditions in a determination apparatus having ports to which a device under test is connected in order to determine parameters, a display means, and a memory means, comprising;
reading said correction conditions of said parameters from said memory means storing said correction conditions; and
displaying a method of calibration used in calibrating said parameters and said ports used for said calibration method in association with each other on said display means, with reference to said read correction conditions, wherein the displaying step includes an indicator conveying the occurrence of an error correction calibration of said parameters and the error correction calibration method.

14. The method of claim 13, wherein said determination apparatus is a network analyzer and said parameter is an S parameter.

15. A determination apparatus having ports connected to a device under test in order to determine parameters, and a memory means, comprising:
means for reading said correction conditions from said memory means storing said correction conditions; and
means for displaying a calibration status of all of said parameters that can be determined and port information relating to the parameters all at once in association with each other on said display means, with reference to said read correction conditions, wherein the means for displaying includes an indicator conveying the occurrence of an error correction calibration of said parameters and the error correction calibration method.

16. The determination apparatus of claim 15, wherein said calibration status and said port information are displayed in matrix form.

17. The determination apparatus of claim 16, further comprising means for indicating said parameters to be determined.

18. The determination apparatus of claim 17, further comprising means for indicating port information relating to said parameters to be determined, wherein port information for conducting said calibration for error correction is indicated when said error correction of said parameters is effective and said port information used in determination of said parameters is indicated when said error correction of said parameters is ineffective.

19. The determination apparatus of claim 15, further comprising:
means for indicating whether an error correction of said parameters is effective.

20. A determination apparatus having ports connected to a device under test In order to determine parameters, a display means, and a memory means, comprising:
means for reading said correction conditions from said memory means storing said correction conditions; and
means for displaying a calibration status of all of said parameters to be determined, and all of said parameters used in calibration of said parameters to be determined, and port information relating to these parameters all at once in relationship to each other, with reference to said read correction conditions, wherein the means for displaying includes an indicator conveying the occurrence of an error correction calibration of said parameters and the error correction calibration method.

21. The determination apparatus of claim 20, wherein said calibration status and said port information are displayed in matrix form.

22. The determination apparatus of claim 20, further comprising means for indicating said parameters to be determined.

23. The determination apparatus of claim 20, further comprising means for indicating said port information relating to said parameters to be determined, wherein port information for conducting said calibration for error correction is effective and said port information used in determination of said parameters is indicated when said error correction of said parameters is ineffective.

24. The determination apparatus of claim 20, further comprising:
means for indicating whether an error correction of said parameters is effective.

25. The determination apparatus of claim 20, wherein said determination apparatus is a network analyzer and said parameter is an S parameter.

26. A determination apparatus having ports connected to a device under test in order to determine parameters, a display means, and a memory means, comprising:
means for reading said correction conditions of said parameters from said memory means storing said correction conditions; and
means for displaying a method of calibration used in calibrating said parameters and said ports used for said calibration method in association with each other, with reference to said read correction conditions, wherein the means for displaying includes an indicator conveying the occurrence of an error correction calibration of said parameters and the error correction calibration method.

27. The determination apparatus of claim 26, wherein said determination apparatus is a network analyzer and said parameter is an S parameter.

* * * * *